United States Patent [19]
Noble, Jr. et al.

[11] Patent Number: 6,022,781
[45] Date of Patent: *Feb. 8, 2000

[54] METHOD FOR FABRICATING A MOSFET WITH RAISED STI ISOLATION SELF-ALIGNED TO THE GATE STACK

[75] Inventors: Wendell P. Noble, Jr., Milton, Vt.; Ashwin K. Ghatalia, Hopewell Junction, N.Y.; Badih El-Kareh, Austin, Tex.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/772,708

[22] Filed: Dec. 23, 1996

Related U.S. Application Data

[62] Division of application No. 08/365,729, Dec. 28, 1994, Pat. No. 5,539,229.

[51] Int. Cl.[7] .......................... H01L 21/08; H01L 29/76; H01L 29/00
[52] U.S. Cl. .......................... 438/296; 438/424; 257/301; 257/305; 257/397; 257/623
[58] Field of Search .................. 438/296, 424; 257/301, 305, 397, 623

[56] References Cited

U.S. PATENT DOCUMENTS

| | | | |
|---|---|---|---|
| 3,936,859 | 2/1976 | Dingwall | 357/23 |
| 4,688,069 | 8/1987 | Joy et al. | 357/34 |
| 5,173,439 | 12/1992 | Dash et al. | 437/67 |
| 5,177,028 | 1/1993 | Manning | 438/296 |
| 5,264,716 | 11/1993 | Kenney | 257/301 |
| 5,298,450 | 3/1994 | Verret | 438/221 |
| 5,369,049 | 11/1994 | Acocella et al. | |
| 5,448,090 | 9/1995 | Geissler et al. | 257/305 |
| 5,539,229 | 7/1996 | Noble et al. | 257/301 |

FOREIGN PATENT DOCUMENTS

| | | | |
|---|---|---|---|
| 154769 | 12/1980 | Japan | 257/396 |
| 191574 | 8/1991 | Japan | 257/384 |

OTHER PUBLICATIONS

S Wolf Silicon Processing for the VSLI ERA vol. II Lattice Press pp. 143–145 and 436–437, 1990.

T. Furukawa et al., "Process and Device Simulation of Trench Isolation Corner Parasitic Device", Proceedings of the Electrochemical Society Meeting, Oct. 9–14, 1988.

A. Bryant et al., "The Current–Carrying Corner Inherent to Trench Isolation", IEEE Electron Device Letters, Vol. 14, No. 8, Aug. 1993.

T. Ishjima et al., "A Deep–Submicron Isolation Technology with T–shaped Oxide (TSO) Structure", Proceedings of the IEDM, 1990, p. 257.

D. Foty et al., "Behavior of an NMOS Trench–Isolated Corner Parasitic Device at Low Temperature", Proceedings of the Eletrochemical Society Meeting, Oct. 1989.

*Primary Examiner*—Charles Bowers
*Assistant Examiner*—David S. Blum
*Attorney, Agent, or Firm*—James M. Leas

[57] ABSTRACT

A semiconductor structure comprising a transistor having a gate conductor that has first and second edges bounded by raised isolation structures (e.g. STI). A source diffusion is self-aligned to the third edge and a drain diffusion is self-aligned to the fourth edge of the gate electrode.

24 Claims, 5 Drawing Sheets

METHOD FOR FABRICATING A MOSFET WITH RAISED STI ISOLATION SELF-ALIGNED TO THE GATE STACK

This application is a divisional of application Ser. No. 08/365,729, now U.S. Pat. No. 5,539,229 filed Dec. 28, 1994 from which priority is claimed under 35 USC 120.

FIELD OF THE INVENTION

This invention generally relates to semiconductor isolation techniques. More particularly, it relates to shallow trench isolation (STI) in which the insulating material is raised above the surface of the semiconductor. Even more particularly it relates to an isolation structure for a transistor in a DRAM cell that provides reduced leakage.

BACKGROUND OF THE INVENTION

Contemporary CMOS technologies employ field effect transistors that are adjacent or bounded by trenches. The trenches are used for shallow trench isolation (STI) or they provide a location for trench capacitors.

Parasitic leakage paths have been created by the proximity of a semiconductor device to an edge or corner of either type of trench. In one leakage mechanism, described in a paper, "Process and Device Simulation of Trench Isolation Corner Parasitic Device," by T. Furukawa and J. A. Mandelman, *Proceedings of the Electrochemical Society Meeting*, Oct. 9–14, 1988, the parasitic leakage path results from an enhancement of the gate electric field near the trench corner. The electric field is enhanced by the corner's small radius of curvature and the proximity of the gate conductor. Processing can exacerbate the problem by sharpening the corner and thinning the gate dielectric near the corner. In addition, in a worst case scenario for corner field enhancement, the gate conductor wraps around the trench corner. This happens when the oxide fill in the isolation trench is recessed below the silicon surface during oxide etches following its formation.

As a result of the enhanced field, the corner has a lower threshold voltage (Vt) than the planar portion of the device. Thus, a parallel path for current conduction is formed. However, for device widths used in contemporary technologies, the top planar portion of the device carries most of the on-current. Trench corner conduction is a parasitic which usually contributes appreciably only to subthreshold leakage. This parasitic leakage current along the corner is most easily seen as a hump in the subthreshold current curve of a narrow MOSFET.

As described in a paper, "The Current-Carrying Corner Inherent to Trench Isolation," by Andres Bryant, W. Haensch, S. Geissler, Jack Mandelman, D. Poindexter, and M. Steger, *IEEE Electron Device Letters*, Vol. 14, No. 8, August, 1993, the corner device can even dominate on-currents in applications such as DRAM that require narrow channel widths to achieve high density. This parallel current-carrying corner device becomes the dominant MOSFET contributor to standby current in low standby power logic applications and to leakage in DRAM cells. Furthermore, there exists concern that the enhanced electric fields due to field crowding at the corner impact dielectric integrity.

A paper, "Behavior of an NMOS Trench-Isolated Corner Parasitic Device at Low Temperature," by D. Foty, J. Mandelman, and T. Furukawa, *Proceedings of the Electrochemical Society Meeting*, October, 1989, suggests that the corner parasitic device does not improve with decreasing temperature nearly as much as the planar subthreshold slope. Thus, the corner parasitic device may be more of a problem at low temperature than the planar device.

This corner leakage problem has commonly been controlled with an increased threshold tailor implant dose, but this can degrade device performance. Thus, alternate schemes for controlling the corner are needed.

A paper, "A Deep-Submicron Isolation Technology with T-shaped Oxide (TSO) Structure," by T. Ishijima et al., *Proceedings of the IEDM*, 1990, p. 257, addresses the problem of trench sidewall inversion. This paper teaches the use of a pair of aligned photomasks to form a T-shaped oxide adjacent the corner of an isolation trench and the use of a channel stop boron implant along sidewalls of the trench. The structure moves the device away from the trench sidewall and provides boron to raise the Vt along that sidewall. However, isolation is enlarged when photomask alignment tolerances are included in this two-mask-and-implant scheme, making this solution undesirable. While commonly assigned copending patent application, "A Corner Protected Shallow Trench Isolation Device," by M. M. Armacost et al., provides a scheme to protect the corner while not enlarging the isolation, the root problem of corner sharpening and oxide thinning remains. Thus, an improved means to control the corner parasitic is needed and is provided by the following invention.

SUMMARY OF THE INVENTION

It is therefore an object of the present invention to avoid corner leakage without degrading device performance.

It is another object of the present invention to prevent the gate conductor from wrapping around the trench corner.

It is another object of this invention to avoid gate dielectric thinning adjacent the corner.

It is another object of this invention to avoid sharpening of the corner.

It is a further object of the present invention to provide a transistor with an individual segment gate conductor and a spacer rail gate connector formed on a separate wiring level.

It is a further object of this invention that the gate conductor is confined to the active device area and the isolation is self-aligned to the gate conductor.

It is a further object of the present invention to provide a wiring level interconnecting individual gate segments of the transistors of an array wherein the wiring level is a sub-minimum dimension conductive spacer rail.

These and other objects of the invention are accomplished by a semiconductor structure comprising a transistor with a gate comprising an individual segment of gate conductor on thin dielectric. The gate conductor is substantially coextensive with the thin dielectric. The gate conductor has a top surface having opposed first and second edges and opposed third and fourth edges. Raised isolation bounds the first and second edges of the gate conductor. A source is self-aligned to the third edge and a drain is self-aligned to the fourth edge. A conductive wiring level is in contact with the top surface.

Another aspect of the invention provides a method of forming an FET comprising the steps of providing a substrate having a gate stack comprising a layer of gate dielectric and a layer of gate conductor, the gate stack having a top surface; removing first portions of the gate stack and etching a trench in the substrate thereby exposed for raised isolation; depositing insulator and planarizing to the top surface of the gate stack; removing second portions of the gate stack for source/drain regions and to expose sidewalls of the gate stack adjacent the source/drain regions; forming spacers adjacent the exposed sidewalls of the gate stack; and forming source/drain diffusions in exposed portions of the source/drain regions.

These and other objects, features, and advantages of the invention will become apparent from the drawings and description of the invention.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present invention provides a transistor having a gate formed from an individual segment of gate conductor. The gate conductor is confined to the active device area, that is the region having thin gate dielectric. STI is self-aligned to the gate conductor. Gate dielectric and gate conductor are formed as blanket layers on the wafer before the isolation trench is etched, and hence sharpening of the corner and thinning of the gate dielectric are avoided. A conductive wiring level contacts this segment gate, and the wiring level can have a subminimum dimension as a result of being formed by a directional etch of a conductor along a sidewall.

STI and processes for forming STI are described in commonly assigned U.S. Pat. No. 5,173,439, by Dash et al., incorporated herein by reference.

The term "horizontal" as used in this application is defined as a plane parallel to the conventional planar surface of a semiconductor chip or wafer, regardless of the orientation the chip is actually held. The term "vertical" refers to a direction perpendicular to the horizontal as defined above. Prepositions, such as "on," "side," (as in "sidewall"), "higher," "lower," "over," and "under" are defined with respect to the conventional planar surface being on the top surface of the chip or wafer, regardless of the orientation the chip is actually held.

Single crystal semiconducting wafers used in the process steps illustrated in FIGS. 1–13 are formed from materials such as silicon, germanium, and gallium arsenide. Because silicon is most widely used and the most is known about its etch properties, silicon will be used for illustration hereinbelow. The wafer may have had implants, diffusions, oxidations, and other process steps completed before embarking on the process sequences described hereinbelow.

Figure 1:
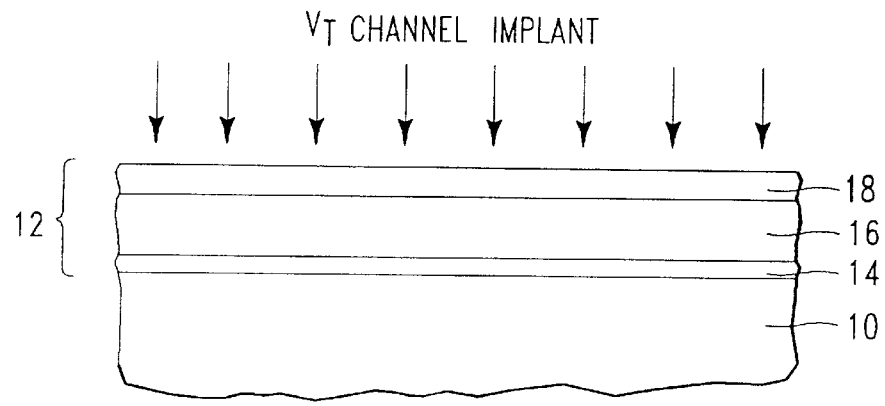
FIGS. 1–8 are cross sectional views showing the structure at several steps in the process for making a semiconductor structure of a first aspect of the present invention.

FIGS. 1–8 show steps in the process of fabricating a transistor or a DRAM cell according to one aspect of the present invention. Referring now to FIG. 1, a "blanket" Vt channel implant is performed on substrate 10 in a region that may encompass an extended portion of the chip or substantially the entire chip. If an array of devices is being formed, for example, the region of the blanket implant encompasses substantially the entire area of the array. Then gate stack 12 is formed in the same region from a sequence of layers, including gate dielectric 14, gate conductor 16, and gate cap dielectric 18. First, a layer of blanket gate dielectric 14 is thermally grown or deposited. Next a layer of gate conductor 16 is blanket deposited. Gate conductor 16 is formed of polysilicon. It can be in-situ doped during the deposition or it can be implanted after deposition to provide the appropriate gate doping. Finally, blanket $Si_3N_4$ cap 18 is deposited on top of the gate conductor 16 to a thickness suitable for use as a planarization etch stop layer.

Figure 2:
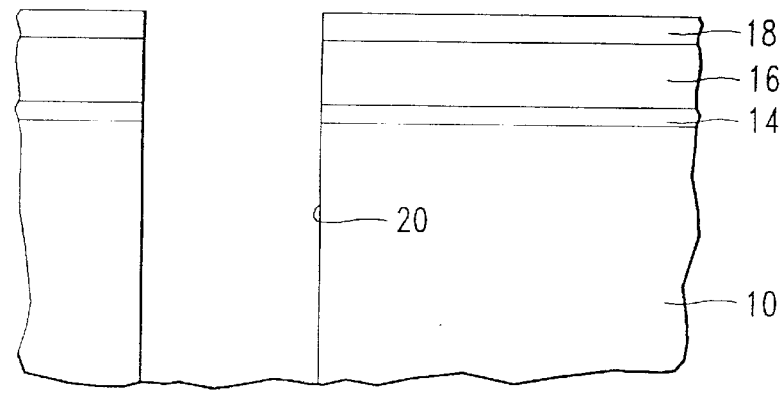
Figure 4:
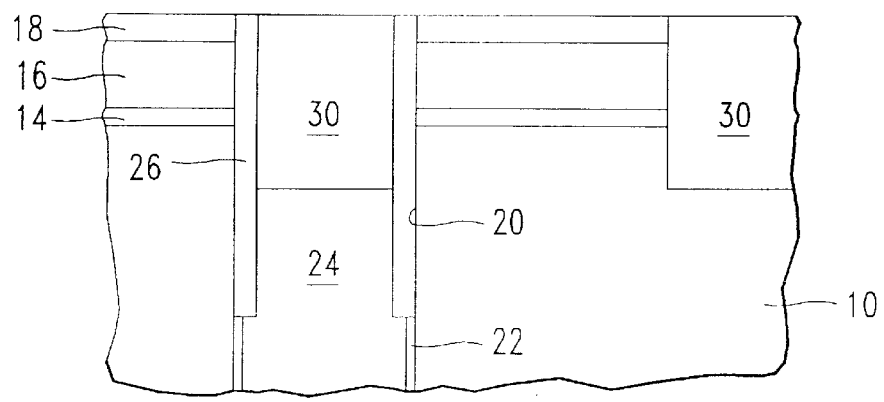

In the next step, photoresist is applied, exposed, and developed to define areas in which the trenches will be formed. The trenches can be STI or storage capacitors. This pattern is first etched in gate cap dielectric 18. The resist may then be stripped, and the pattern in nitride gate cap dielectric 18 is used to continue the etch in gate conductor 16 and exposed gate dielectric 14. Finally, the etch is extended into silicon substrate 10 to form raised deep trench 20 for a capacitor, as shown in FIG. 2, or raised shallow trench 30 for STI, as illustrated in FIG. 4. The term "raised trench" refers to the fact that the trench extends beyond the surface of substrate 10 to the top of the gate stack. In this process, a single masking step defines the edge between the trench and gate stack and provides perfect alignment therebetween. Thus, the gate is bounded by a raised trench on two opposite sides. However, since the gate dielectric and gate conductor were formed as blanket layers before the trench was etched, there is no corner sharpening, no gate dielectric thinning, and no gate wrap around.

Figure 3:
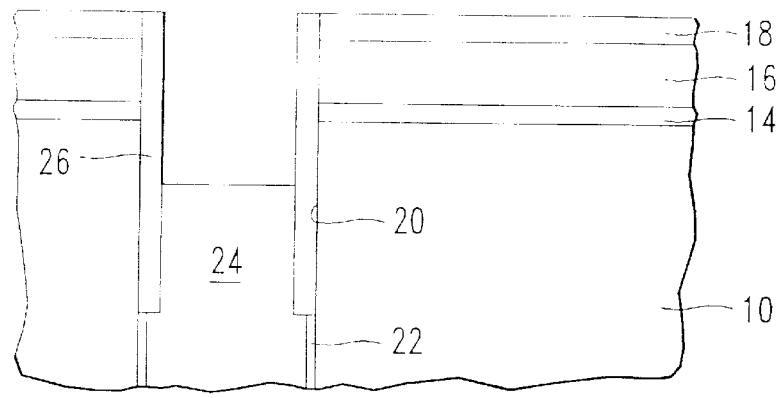

As shown in FIG. 3, storage node insulator 22 and storage electrode 24 are formed in raised deep trench 20 as described in commonly assigned U.S. Pat. No. 5,264,716 ("the '716 patent"), issued to D. M. Kenney, entitled "Diffused Buried Plate Trench Dram Cell Array," incorporated herein by reference. In brief, storage node insulator 22 is a formed by growing thermal oxide, depositing silicon nitride, and oxidizing a surface layer of the nitride. Raised deep trench 20 is then filled with doped polysilicon for storage electrode 24 of the capacitor. This polysilicon may be recessed to form insulating collar 26. FIG. 3 illustrates the cell at this step in the process.

In a similar process to that described above for the raised deep trench, raised shallow trench isolation (raised STI) 30 is formed. Referring to FIG. 4, after the photomasking and gate stack etching steps as described above, a silicon etch is used in silicon substrate 10 to form shallow trenches for raised STI 30. Then a passivation oxide is thermally grown along surfaces of the silicon thereby exposed. TEOS is then deposited to fill the shallow trenches (and the top of deep trench 20). Next, a planarization step is implemented stopping on the nitride cap of the gate stack. Thus, raised STI is provided adjacent a sidewall of the gate stack. Of course, raised STI 30 can intersect deep trench 20 in a manner similar to that shown for standard STI in the '716 patent.

Figure 5:
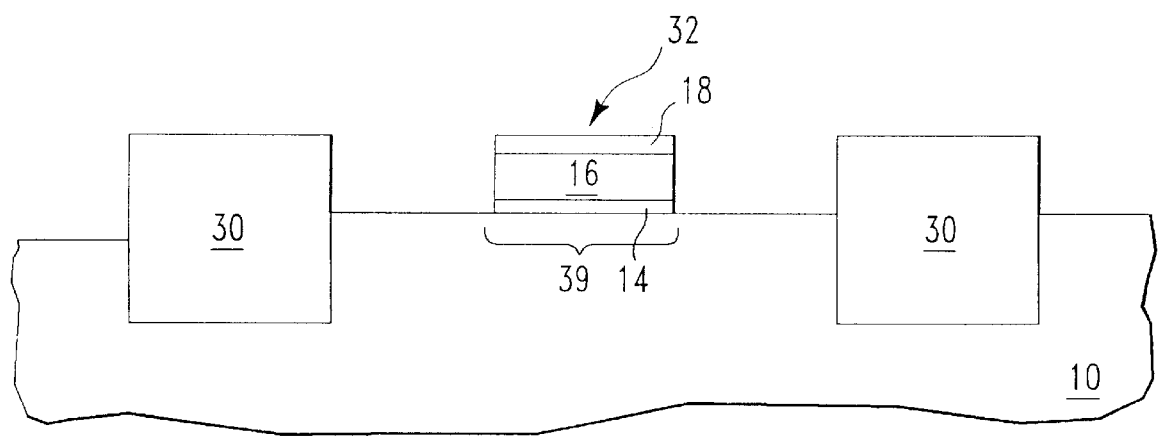

Next, source/drain regions of the active area are defined using a process similar to that described above for raised deep trench 20 and raised STI 30. Referring to FIG. 5, a cross section orthogonal to the cross section of FIG. 4, photomasking and gate stack etching steps as described above are used to form the desired pattern of gate segments 32. This etch leaves polysilicon only over channel region 34, on which there is gate dielectric 14, and defines the channel length of the transistor in the process of being fabricated. Silicon on the two sides of the gate stack thereby exposed will be diffused for the source/drain. The other two sides of the gate stack are bounded by raised storage trench 20 or raised STI 30.

Figure 6:
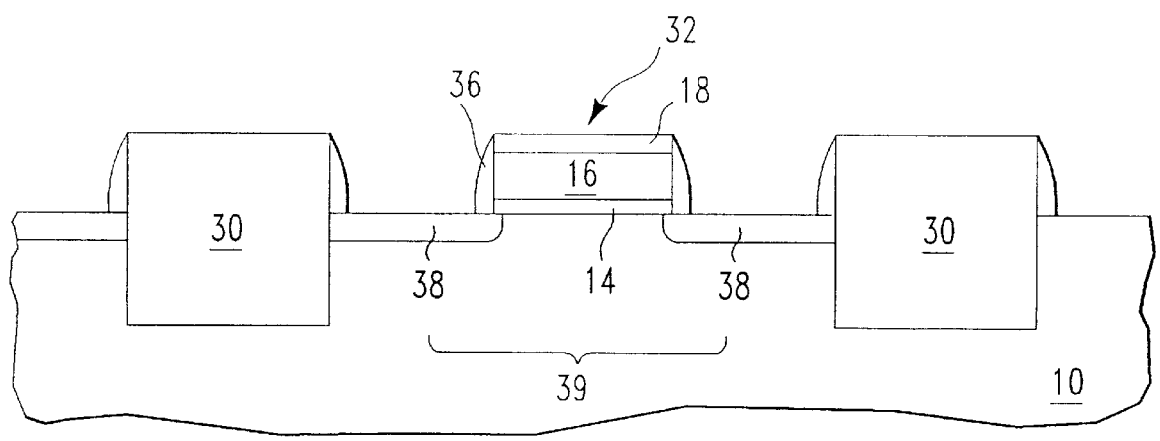

In the next step, illustrated in FIG. 6 dielectric sidewall spacers 36 are grown or deposited on the two exposed edges of gate stack 32. Spacers 36 are typically formed of a thermally grown oxide along sidewalls of gate conductor 16 and a deposited silicon nitride that is directionally etched to remove nitride along horizontal surfaces while leaving nitride spacers along sidewalls. After spacers 36 are formed, source/drain regions 38 of transistor 39 are formed by diffusion or ion implant. The diffusion or implant is self-aligned to spacers 36 formed along edges of gate stack 32 and is bounded by raised STI 30 or raised storage trench 20. The diffusion for source/drain regions 38 may be provided by depositing a doped glass or a doped polysilicon layer. The doped layer is planarized, and may be masked and etched to define the NMOS and PMOS regions. Wafers are then subjected to an activation, drive-in thermal cycle. Diffused regions or the doped polysilicon can be silicided to lower resistance. The use of doped polysilicon as a doping source for source/drain regions 38 provides the advantage of allowing the formation of shallow junctions while providing a large volume of material for source/drain regions 38. The shallow junctions reduce short channel effects. The large volume of material allows siliciding without danger of high junction leakage.

The next steps provide a node strap, wordline connector, and bitline contact, and these steps are described in copending patent application "A Five Square FoldedBitline DRAM Cell," by Wendell Noble, ("the Noble patent application") incorporated herein by reference. Briefly, an intrinsic polysilicon mandrel is deposited and a contact opening formed therein. Heavily doped polysilicon is then deposited forming the strap between node polysilicon and the node diffusion. A selective etch is then used to remove the intrinsic polysilicon, leaving the heavily doped strap.

Figure 7:
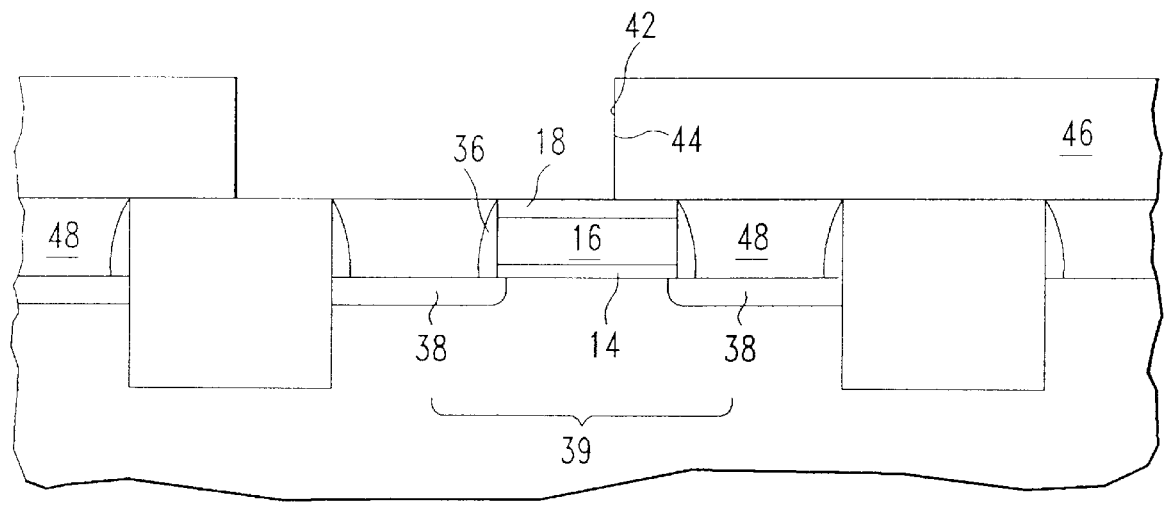
Figure 8:
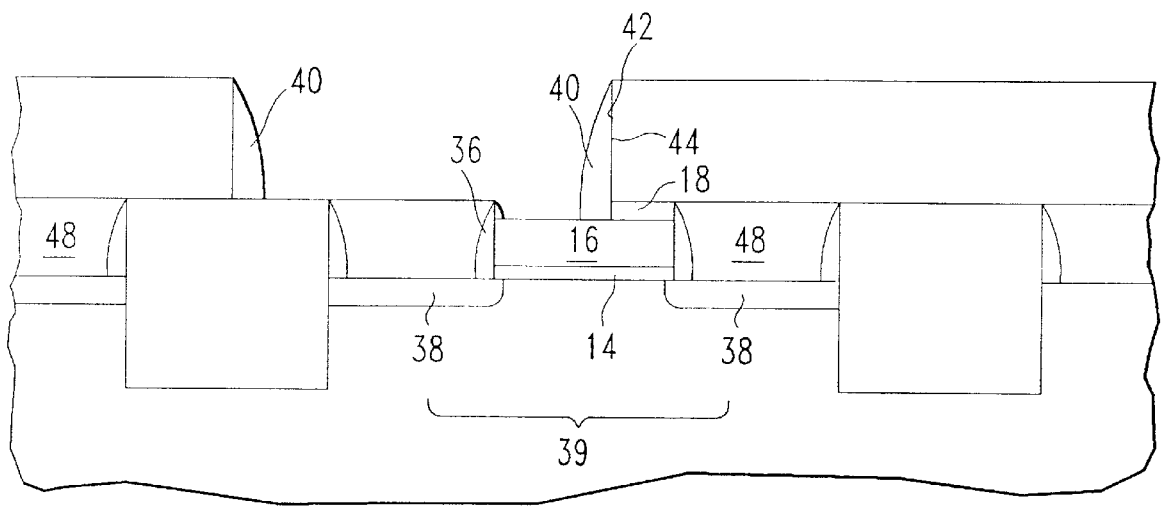

Subminimum dimension wordline interconnect wiring 40 is formed as a spacer along sidewall 42 of groove 44 in second intrinsic polysilicon mandrel 46, as illustrated in FIGS. 7 and 8. After insulator 48 is deposited and planarized, stopping on cap 18, intrinsic polysilicon mandrel 46 is deposited (FIG. 7). Groove 44 in mandrel 46 is formed photolithographically aligned so that sidewall 42 extends over a portion of gate conductor 16. The etch to form groove 44 extends through mandrel 46 down to expose nitride cap 18 over gate segment . A directional etch removes the portion of nitride cap 18 from gate conductor 16 that is exposed within groove 44. A conductor, such as tungsten, aluminum, or doped polysilicon is deposited and directional etched, leaving subminimum dimension conductive sidewall spacer rail 40 contacting gate conductor 16 along sidewall 42 (FIG. 8).

Figure 9:
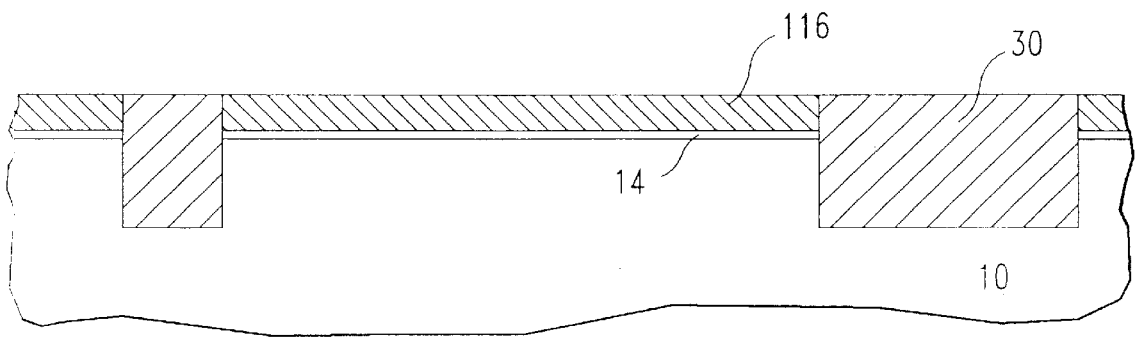
FIGS. 9–13 are cross sectional views showing the structure at several steps in the process for making a semiconductor structure of a second aspect of the present invention.
Figure 10:
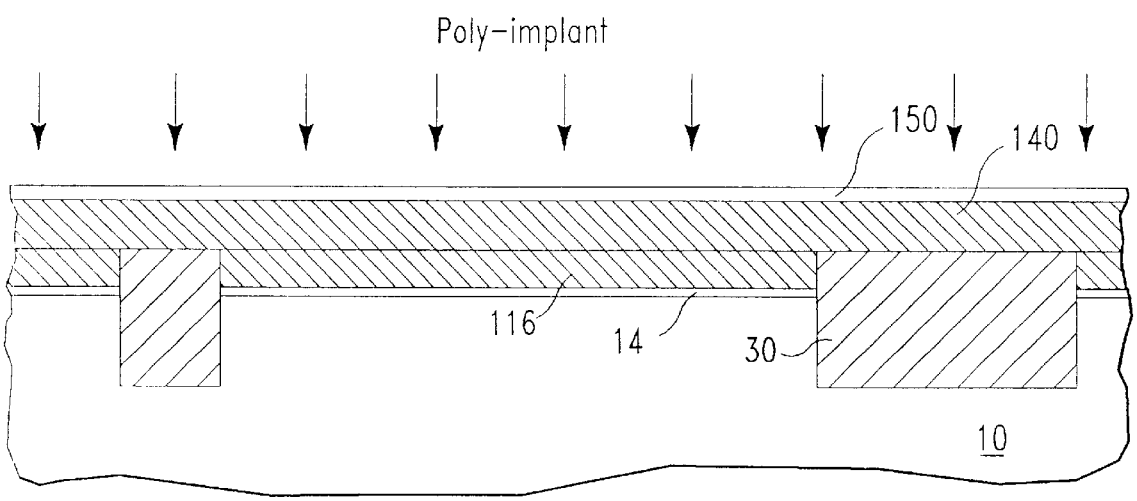
Figure 11:
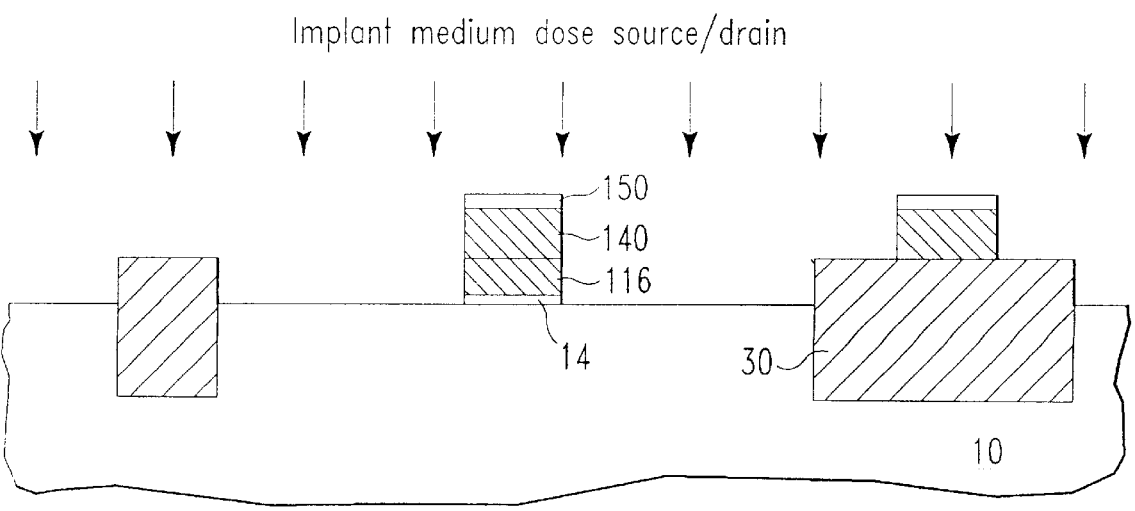
Figure 12:
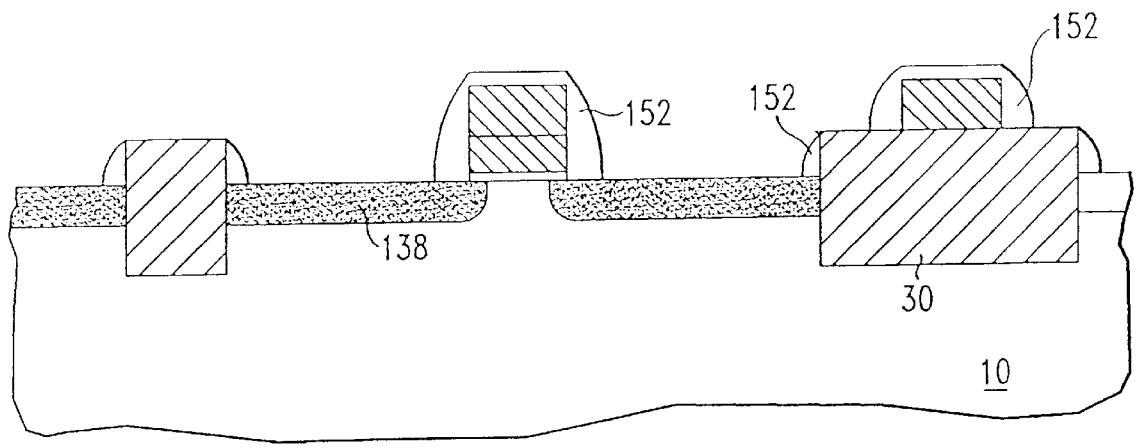

FIGS. 9–13 show steps an alternate aspect of the invention in which conductive wiring level 140 interconnects gate segments 132 of transistor 139 that is isolated by raised STI 30. Transistor 139 may be part of a logic circuit, SRAM, or other semiconductor circuit. In this aspect of the invention, conductive wiring level 140 is formed before the step illustrated in FIG. 5. After the dielectric of raised STI 30 is planarized (FIG. 4), planarization continues, stopping on the surface of gate conductor 116 as shown in FIG. 9. A second layer of conductor for conductive wiring level 140, such as doped polysilicon or tungsten, is then deposited as illustrated in FIG. 10. Conductive wiring level 140, is formed of a low resistivity material such as a metal or a metal silicide. Metals such as tungsten, molybdenum, titanium, or aluminum, are suitable. The low resistivity material can be deposited by methods known in the art, such as chemical vapor deposition. It can also be formed from heavily doped polysilicon. A layer of insulator 150 may also then be deposited. The source/drain defining mask is then used as described above (FIG. 5) and the two layers of conductor (gate conductor 116 and conductive wiring level 140) are etched such that gate conductor 116 is substantially confined to the active area of each transistor and conductive wiring level 140 extends over STI 30 to interconnect transistors or cells, as shown in FIG. 11. Dielectric spacers 152 formed in the next step (FIG. 12), coat both gate segments and conductive wiring level interconnects. While the interconnect wiring in this aspect of the invention is not subminimum dimension, this aspect provides a simpler manufacturing process and still provides the other advantages of the invention described below.

Figure 13:
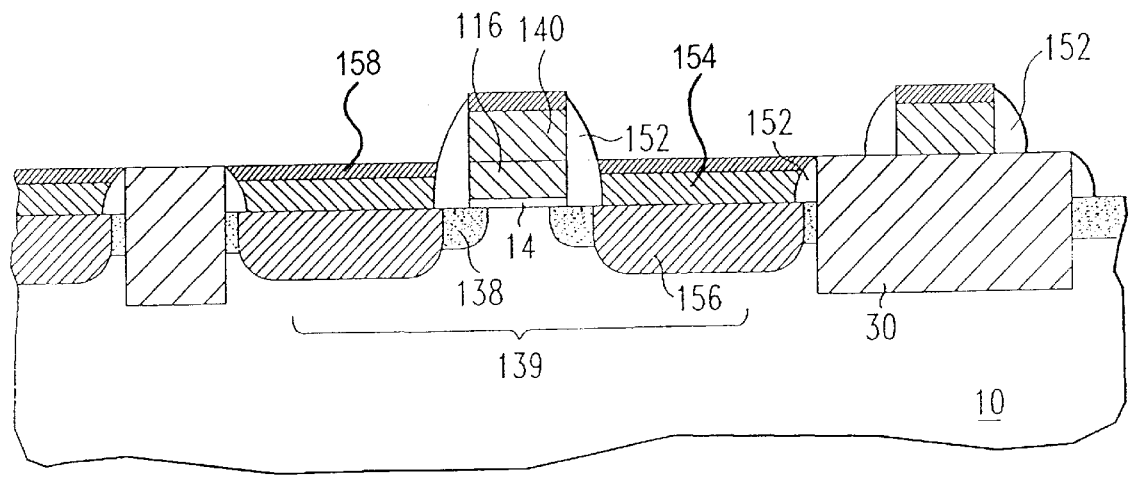

In the aspect of the invention illustrated in FIGS. 9–13 a source/drain extension is first formed by implanting a medium dose (less than $1\times10^{14}$ cm$^{-2}$) of a dopant such as arsenic or boron, for source/drain 138 before spacers 152 are formed (FIG. 11). Then, after spacers 152 are formed (FIG. 12), intrinsic polysilicon (or intrinsic amorphous silicon) is deposited for raised source/drain 154 as shown in FIG. 13. Dopant for the raised source/drain is implanted at low energy so as to avoid damage to the single crystal silicon below. Then the dopant is diffused from the polysilicon to form ultrashallow junctions 156 without damage. A refractory metal, such as titanium is then deposited and annealed to form silicide 158 in polysilicon raised source/drain 154. Thus, ultrashallow junctions 156 are formed that have both the low resistance associated with a silicide and very low leakage. The junctions so formed can have a depth of as little as about 500 A. Of course, other methods of doping the polysilicon of raised source/drain 154 can be used, such as in-situ doping.

The device and isolation structure of the invention described hereinabove offers several key advantages. First, STI and storage trench comer parasitic problems are reduced because (1) comner sharpening and gate dielectric thinning are eliminated (since the gate dielectric is formed on a planar surface before device edges are defined); and (2) gating of the sidewall of the channel or its corner by the gate is eliminated since the gate is bounded by raised isolation—the gate does not wrap around the corner.

Second, because polysilicon gate 116 does not extend over field regions under STI 30, field doping under STI 30 and STI thickness requirements can be relaxed.

Third, as described in the Noble patent application, layout distance between individual device gates can be substantially reduced when the wordline conductor interconnecting gate segments is a subminimum dimension spacer rail. In the DRAM cell described in the Noble application, for example, savings in DRAM cell area of up to 37.5% is achieved.

While several embodiments of the invention, together with modifications thereof, have been described in detail herein and illustrated in the accompanying drawings, it will be evident that various further modifications are possible without departing from the scope of the invention. For example, a wide range of materials can be used for mandrel 46, and for rail 40 or conductive wiring level 140. The invention can be practiced with n- or p-channel transistors with corresponding changes in the doping of the polysilicon strap and node polysilicon. Nothing in the above specification is intended to limit the invention more narrowly than the appended claims. The examples given are intended only to be illustrative rather than exclusive.

What is claimed is:

1. A method of forming an FET comprising the steps of:
   a) providing a semiconductor substrate;
   b) providing a gate stack on said substrate, said gate stack comprising a layer of gate dielectric and a layer of gate conductor on said gate dielectric, said gate stack having a top surface;

c) removing a portion of said gate stack;

d) etching at least one trench in said substrate exposed in said removing step (c);

e) depositing insulator in said at least one trench and planarizing said insulator to said top surface to provide raised trench isolation, wherein a remaining portion of gate stack is surrounded by said raised trench isolation;

f) removing portions on opposite sides of said remaining portion of gate stack to provide a segment gate, said segment gate having opposed first and second edges and opposed third and fourth edges, said trench insulator self-aligned to said first and second edges, said trench insulator spaced from said third and fourth edges for source and drain diffusions; and g) forming source and drain diffusions self-aligned to said third and fourth edges;and h) depositing a wiring level contacting said segment gate, wherein said wiring level comprises a permanent conductive spacer.

2. A method as recited in claim 1 wherein said conductive spacer comprises a word line.

3. A method of forming an isolation for an FET comprising the steps of:

a) providing a semiconductor substrate;

b) providing a gate stack on said substrate, said gate stack comprising a layer of gate dielectric and a layer of gate conductor on said gate dielectric, said gate stack having a top surface;

c) removing a first portion of said gate stack;

d) etching a first trench in said substrate exposed in said removing step (c), said first trench having a first depth;

e) depositing conductor in said first trench, recess etching said conductor, depositing insulator in said recess, and planarizing said insulator to said top surface to provide a first raised trench isolation;

f) removing a second portion of said gate stack;

g) etching a second trench in said substrate exposed in said removing step (f), said second trench having a second depth different from said first depth; and h) depositing insulator in said second trench and planarizing said insulator to said top surface to provide a second raised trench isolation.

4. A method as recited in claim 3 wherein said first trench comprises a trench capacitor.

5. A method as recited in claim 3 wherein said depositing step (e) and said depositing step (h) are accomplished in a single deposition step.

6. A method as recited in claim 3 further comprising the steps of:

i) removing portions on opposite sides of said remaining portion of gate stack to provide a segment gate, said segment gate having opposed first and second edges and opposed third and fourth edges, said trench insulator self-aligned to said first and second edges, said trench insulator spaced from said third and fourth edges for source and drain diffusions; and j) forming source and drain diffusions self-aligned to said third and fourth edges; and k) depositing a wiring level contacting said segment gate.

7. A method as recited in claim 6 wherein in said step (j) forming spacers adjacent said third and fourth edges.

8. A method as recited in claim 6 wherein said step (j) is accomplished by the step of forming a raised source/drain and diffusing from said raised source and drain.

9. A method as recited in claim 6 wherein in said depositing step (k) said wiring level is defined in a step separate from said removing step (i).

10. A method as recited in claim 6 wherein said depositing step (h) comprises the step of forming a conductive spacer.

11. A method as recited in claim 10 wherein said step (j) is accomplished by the step of forming a raised source/drain and diffusing from said raised source and drain.

12. A method as recited in claim 11 wherein said conductive spacer comprises a word line.

13. A method as recited in claim 10 wherein said conductive spacer comprises a word line.

14. A method of forming an FET comprising the steps of:

a) providing a semiconductor substrate;

b) providing a gate stack on said substrate, said gate stack comprising a layer of gate dielectric and a layer of gate conductor on said gate dielectric, said gate stack having a top surface;

c) removing a portion of said gate stack;

d) etching a trench in said substrate exposed in said removing step (c);

e) depositing insulator in said trench and planarizing said insulator to said top surface to provide raised trench isolation, wherein a remaining portion of gate stack is surrounded by said raised trench isolation to provide a segment gate;

f) removing portions on opposite sides of said remaining portion of gate stack, said segment gate having opposed first and second edges and opposed third and fourth edges, said first and second edges adjacent said trench insulator, wherein removing portions provides spacing between said trench insulator and said third and fourth edges for source and drain diffusions;

g) depositing a raised source and a raised drain and diffusing from said raised source and drain to provide diffusions self-aligned to said third and fourth edges without shorting said raised source or drain to said segment; gate and h) providing for contact to said segment gate.

15. A method as recited in claim 14 wherein said raised source/drain is formed by the steps of depositing amorphous or polycrystalline silicon, planarizing said silicon, and etching said silicon, said etching step leaving a portion of said silicon in said exposed portions of said source/drain regions.

16. A method as recited in claim 15 further comprising the step of doping said silicon.

17. A method as recited in claim 15 wherein said planarizing step is accomplished by polishing.

18. A method as recited in claim 15 wherein said planarizing step is accomplished by a planarizing etch.

19. A method as recited in claim 14 wherein said raised source/drain is formed by the step of forming selective silicon seeded from said source drain region.

20. A method as recited in claim 19 further comprising the step of siliciding said raised source and drain.

21. A method as recited in claim 14 further comprising the step (h) of depositing a wiring level contacting said segment gate and defining said wiring level in a step separate from said removing step (f).

22. A method as recited in claim 1 wherein said depositing step (h) comprises the step of forming a conductive spacer.

23. A method as recited in claim 22 wherein said conductive spacer comprises a word line.

24. A method as recited in claim 14 wherein in said step (g) further comprises forming spacers adjacent said third and fourth edges.

* * * * *